United States Patent
Jeong et al.

(10) Patent No.: US 7,456,901 B2
(45) Date of Patent: Nov. 25, 2008

(54) IMAGE SENSOR MODULE AND CAMERA MODULE PACKAGE INCLUDING THE SAME

(75) Inventors: Ha-cheon Jeong, Yongin-si (KR); Jung-kang Lyu, Yongin-si (KR); Dong-hyeon Yoon, Yongin-si (KR); San-deok Hwang, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 827 days.

(21) Appl. No.: 10/945,469

(22) Filed: Sep. 20, 2004

(65) Prior Publication Data

US 2005/0184352 A1 Aug. 25, 2005

(30) Foreign Application Priority Data

Feb. 20, 2004 (KR) .................. 10-2004-0011322

(51) Int. Cl.
*H04N 5/225* (2006.01)
*H01L 31/0203* (2006.01)

(52) U.S. Cl. .................. 348/374; 257/434; 250/239

(58) Field of Classification Search ............... 348/374, 348/373; 257/433, 434, 432; 250/239, 280.1
See application file for complete search history.

(56) References Cited

U.S. PATENT DOCUMENTS

| | | | |
|---|---|---|---|
| 5,130,804 A | | 7/1992 | Tamura et al. |
| 6,127,833 A | * | 10/2000 | Wu et al. .................... 324/755 |
| 6,674,159 B1 | * | 1/2004 | Peterson et al. ............. 257/432 |
| 6,841,863 B2 | * | 1/2005 | Baik et al. .................... 257/686 |
| 7,365,424 B2 | * | 4/2008 | Seng et al. .................... 257/433 |
| 2001/0004128 A1 | * | 6/2001 | Park et al. .................... 257/680 |
| 2001/0050717 A1 | | 12/2001 | Yamada et al. |
| 2001/0050721 A1 | * | 12/2001 | Miyake ....................... 348/374 |
| 2003/0128442 A1 | * | 7/2003 | Tanaka et al. ............... 359/819 |
| 2003/0164891 A1 | * | 9/2003 | Akimoto ..................... 348/340 |
| 2003/0223008 A1 | * | 12/2003 | Kim et al. ................... 348/340 |
| 2004/0212717 A1 | * | 10/2004 | Minamio et al. ............ 348/340 |

FOREIGN PATENT DOCUMENTS

| | | |
|---|---|---|
| CN | 1330487 A | 1/2002 |
| JP | 09-55487 A | 2/1997 |
| JP | 2002-010116 A | 1/2002 |

* cited by examiner

*Primary Examiner*—Lin Ye
*Assistant Examiner*—Jason Whipkey
(74) *Attorney, Agent, or Firm*—Drinker Biddle & Reath LLP

(57) ABSTRACT

A camera module package includes an image sensor module that can be formed as a chip scale package (CSP) with a wire bonding structure. The image sensor module includes an image sensing device unit having an image sensing device, a pixel area part formed on a surface of the image sensing device, and a device connecting pad formed on a surface of the image sensing device for electrically connecting to external devices; a circuit board to which the image sensing device unit is attached on one surface, to which a board connecting pad that is electrically connected to the image sensing device unit is formed on the other surface, and that contains holes corresponding to locations of the pixel area part and the device connecting pad; and a connecting unit for connecting the device connecting pad and the board connecting pad.

27 Claims, 3 Drawing Sheets

IMAGE SENSOR MODULE AND CAMERA MODULE PACKAGE INCLUDING THE SAME

BACKGROUND OF THE INVENTION

This application claims the priority of Korean Patent Application No. 2004-11322, filed on Feb. 20, 2004, in the Korean Intellectual Property Office, the disclosure of which is incorporated herein in its entirety by reference.

1. Field of the Invention

The present invention relates to a camera module package having an image sensor module on a circuit board, and, more particularly, to an image sensor module on which a circuit board and a semiconductor device mounted on the circuit board are connected by a wire bonding method, the image sensor module being included in a camera module for small electrical appliances by which moving picture can be transmitted and pictures can be taken, such as a mobile phone, a notebook computer, a personal digital assistant (PDA), a camera for a monitor, a rear view camera that is installed on a car bumper, and a door/interphone.

2. Description of the Related Art

FIG. 1 is a schematic cross-sectional view showing the structure of a camera module package that incorporates an image sensor module using a wire bonding method.

Referring to FIG. 1, the image sensor module 10 is formed by mounting an image sensing device unit 12 on a printed circuit board 11 that contains a circuit pattern. A housing 20 is attached to the printed circuit board 11 to form a camera module package incorporating the image sensor module 10, which includes the printed circuit board 11 and the image sensing device unit 12. The housing 20 protects the camera module, including the image sensor module, from the external environment and maintains an airtight state within the housing.

The housing 20 includes a lens barrel unit 21, a protective cover 22, and an infrared ray and reflection prevention filter 23. The protective cover is installed on the outer end portion of the lens barrel unit 21, through which passes images to be photographed. The infrared ray and reflection prevention filter 23 is installed on the inner end portion of the lens barrel unit 21, that is, on the upper portion of the image sensing device unit 12.

The protective cover 22 is for protecting the image sensor module 10 from the external environment and maintaining airtight status. Also, the infrared ray and reflection prevention filter 23 is for shielding infrared rays induced into the bonding camera module package 20 and preventing light from being reflected. An infrared ray (IR)-cut coating is formed on the upper surface of the filter 23, and an anti-reflection coating is formed on the lower surface of the filter 23. A lens 24 for taking photographs is installed in the lens barrel unit 21, and a thread for moving the lens in order to focus is formed on an inner surface of the lens barrel unit 21.

Here, the image sensing device unit 12 includes an image sensing device 12a and a pixel area part 12b. The pixel area part 12b is formed on a range of the image sensing device 12a, on which a bottom surface of the lens barrel unit 21 is located. The image is formed by passing through a space formed in the pixel area part and in the lens barrel unit 21.

A board connecting pad 14 and a device connecting pad 15 are formed on the printed circuit board 11 and the image sensing device unit 12, respectively, in order to electrically connect them to external devices. In order to electrically connect the printed circuit board 11 and the image sensing device unit 12, the board connecting pad 14 and the device connecting pad 15 are connected to each other by a bonding wire 16.

Here, the board connecting pad 14 is formed on an outer portion on the printed circuit board 11 where the image sensing device unit 12 is not located. The device connecting pad 15 is formed on an outer portion of the image sensing device 12a where the pixel area part 12b is not located. The device connecting pad 15 is electrically connected to the board-side connecting pad 14 through the wire bonding 16.

As described above, in a case where a small size camera module for transmitting moving pictures and for taking pictures is constructed using the conventional packaging method, which electrically connects the printed circuit board and the semiconductor device through the wire bonding method, a predetermined distance should be ensured to exist between the connecting pad of the semiconductor pad and the connecting pad formed on the circuit board. Thus, there is a limit for reduction of the width of the semiconductor package.

A predetermined effective distance should be maintained between the lens 24 and the pixel area part 12b in order to focus the image on the pixel area part. According to the camera module package including the image sensor module by the wire bonding of the conventional art, since the image sensing device is mounted on the circuit board and the pixel area part is formed on the upper surface of the image sensing device, there is a limit to reducing the height of the image sensor module for ensuring the effective distance.

Generally, in order to construct a chip scale package (CSP) that overcomes the limits of the package size, the circuit board and the semiconductor device thereon may be electrically connected in a flip chip bonding method. However, in order to use the flip chip bonding method, new equipment for performing the flip chip bonding process needs to be furnished. In addition, if the semiconductor package uses the flip chip bonding method, although the width of the image sensor module can be reduced, there is a limit to reducing the height of the image sensor module.

SUMMARY OF THE INVENTION

The present invention provides an image sensor module, in which an image sensing device is mounted on a circuit board, for forming a chip size package (CSP) that can be manufactured in a wire bonding process, and provides a camera module package that includes such an image sensor module.

According to an aspect of the present invention, there is provided an image sensor module that includes an image sensing device unit, a circuit board, and a connecting unit. The image sensing device unit includes an image sensing device, a pixel area part, and a device connecting pad. The pixel area part is formed on a surface of the image sensing device, and on the pixel area part is photographed an image input from outside the module. The device connecting pad is formed on a surface of the image sensing device for electrically connecting to external devices. The image sensing device unit is attached to one surface of the circuit board. A board connecting pad is formed on the other surface of the circuit board, and is electrically connected to the image sensing device unit. The circuit board contains holes corresponding to the locations of the pixel area part and the device connecting pad. The connecting unit connects the device connecting pad and the board connecting pad.

According to another aspect of the present invention, there is provided a camera module package including an image sensing device unit, a circuit board, a connecting unit, and a housing. The image sensing device unit includes an image sensing device, a pixel area part, and a device connecting pad. The pixel area part is formed on a surface of the image sensing device, and on the pixel area part is photographed an image input from outside the module. The device connecting pad is formed on a surface of the image sensing device for electrically connecting to external devices. The image sensing device unit is attached to one surface of the circuit board. A board connecting pad is formed on the other surface of the circuit board, and is electrically connected to the image sensing device unit. The circuit board contains holes corresponding to the locations of the pixel area part and the device connecting pad. The connecting unit connects the device connecting pad and the board connecting pad. The housing is attached to the circuit board and protects the module from external conditions while maintaining an airtight status.

The housing may include a lens barrel unit for passing an image captured from outside; a protective cover installed on the outer end portion of the lens barrel unit for protecting the inside of the camera module package and maintaining the airtight status; an infrared ray and reflection prevention filter installed at the inner end portion of the lens barrel unit near the pixel area part for shielding against infrared rays and preventing light induced into the image sensing device unit from being reflected; and a lens mounted in the lens barrel unit so as to be moved along threads that are formed on the inner surface of the lens barrel unit.

The present invention also provides an image obtaining apparatus including the camera module package.

Thus, a CSP having reduced width and height can be formed even when the CSP is formed in the wire bonding method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 2:
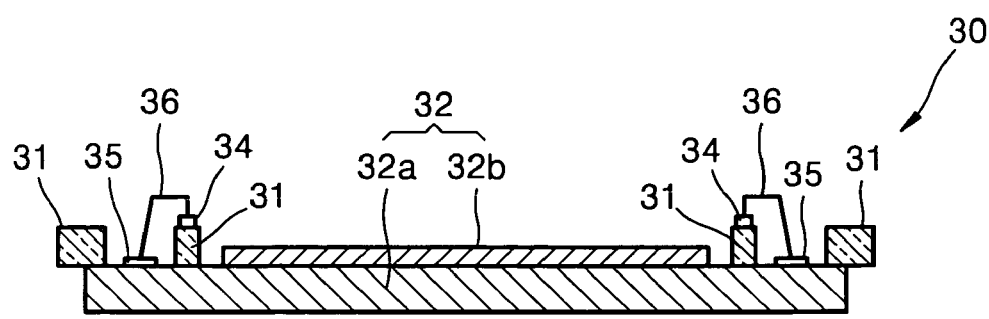
FIG. 2 is a schematic cross-sectional view showing an image sensor module using a wire bonding method according to an exemplary embodiment of the present invention.
Figure 3:
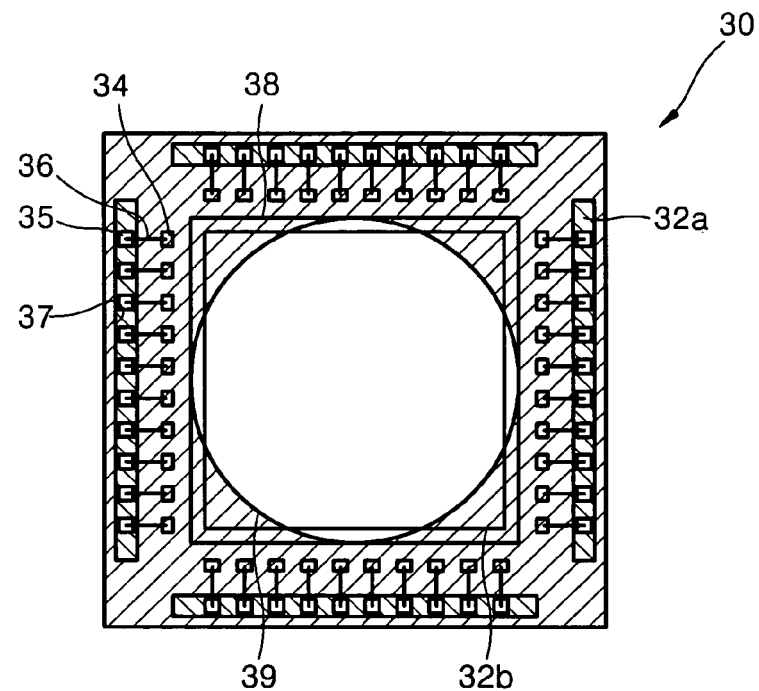
FIG. 3 is a schematic plan view showing a structure of the image sensor module of FIG. 2.

FIG. 2 is a schematic cross-sectional view showing a structure of an image sensor module using a wire bonding method according to an embodiment of the present invention, and FIG. 3 is a schematic plan view showing the structure of the image sensor module of FIG. 2. FIGS. 2 and 3 are not completely to scale with respect to each other.

Referring to FIGS. 2 and 3, the image sensor module 30 includes an image sensing device unit 32, a circuit board 31, and a connecting unit 36.

The image sensing device unit 32 includes an image sensing device 32a and a pixel area part 32b. The pixel area part 32b, which senses an image input from the outside, is formed on the surface of an image sensing device 32a. A device connecting pad 35 for external electrical connection is formed on the surface of the image sensing device 32a. The image sensing device unit 32 is attached to one surface of the circuit board 31, and a board connecting pad 34 that is electrically connected to the image sensing device is formed on the other surface of the circuit board 31. In addition, the regions where the pixel area part 32b and the device connecting pad 35 are located are bored. The connecting unit 36 electrically connects the device connecting pad 35 and the board connecting pad 34.

The image sensing device unit 32 may include the image sensing device 32a, the pixel area part 32b formed on the image sensing device 43, and the device connecting pad 35 formed on the image sensing device 32a. Here, it is desirable that the image sensing device unit 32 is attached to the circuit board 31 so that the surface of the image sensing device 32a where the pixel area part 32b is attached can be attached to the circuit board 31.

As shown in FIG. 3, the regions of the circuit board 31, where the pixel area part 32b and the device connecting pad 35 are located, are bored. That is, the circuit board 31 includes bonding holes 37 in order to form the board connecting pad 34 that is connected to the device connecting pad 35 in a wire bonding method, and a window hole 38 for forming the pixel area part 32b and a lens area 39.

Here, a general printed circuit board (PCB) can be used as the circuit board 31, or a flexible printed circuit board (FPCB) such as a tape carrier package (TCP) and a chip on film (COF) can be used according to modifications of the image sensor module.

The connecting unit 36 is for electrically connecting the device connecting pad 35 and the board connecting pad 34, and it is desirable that the connecting unit 36 is a bonding wire for connecting the circuit board 31 and the image sensing device unit in the wire bonding method. Here, a wire used in a general wire bonding method can be used as the bonding wire. For example, a gold wire can be used.

The device connecting pad 35 is connected to the board connecting pad 34 that is formed on the circuit board 31 in the wire bonding method. Here, the circuit board 31 has a similar size to that of the image sensing device 32a, and can be modified according to an image obtaining apparatus adopting the image sensor module 30 of the present invention.

It is desirable that the device connecting pad 35 is formed on the same surface of the image sensing device 32a, where the pixel area part 32b of the image sensing device unit 32 is formed, and especially, it is desirable that the device connecting pad 35 is formed on a region of the image sensing device 32a, where the pixel area part 32b is not located. In addition, it is desirable that the board connecting pad 34 is formed on a surface opposite to the surface of the circuit board 31 where the image sensor 32 is attached.

Here, it is desirable that the device connecting pad 35 is attached on a surface of the image sensing device 32a so as to be located on the region of the circuit board 31, where the bonding hole 37 is formed, in an arrangement where the image sensing device 32a is attached to the circuit board 31. Otherwise, the device connecting pad 35 can be formed on the region of the image sensing device 32a, where the window hole 38 is located, so that the device connecting pad 35 and the board connecting pad 34 can be connected to each other in the wire bonding method without forming the bonding hole 37 on the circuit board 31.

Therefore, the image sensor module 30 including the circuit board 31 and the image sensing device unit 32, which are electrically connected to each other through the wire bonding, has nearly the same width as that of the image sensing device unit 32. In addition, since the pixel area part 32b of the image sensing device unit is inserted into the window hole 38 formed on the circuit board 31, the height of the image sensor module can be reduced.

Figure 1:
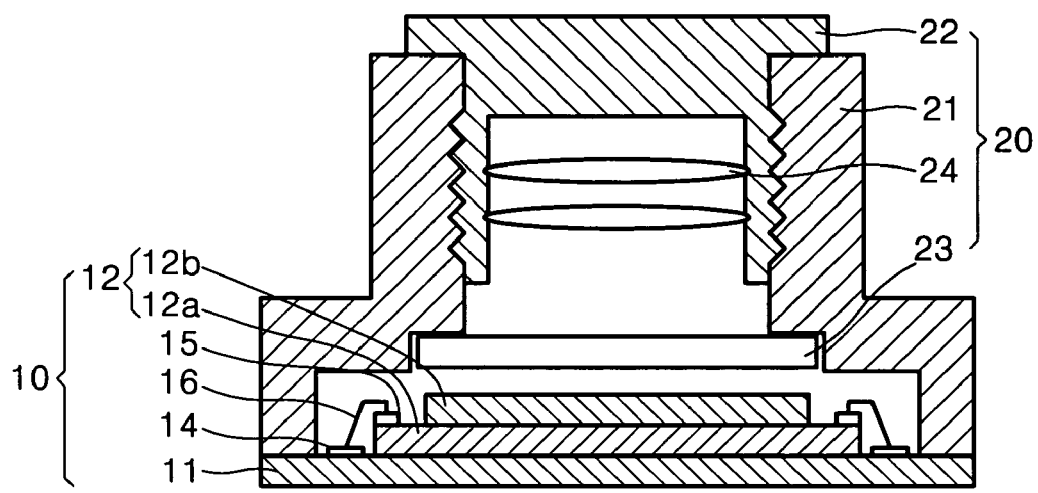
FIG. 1 is a schematic cross-sectional view showing a camera module package including a conventional image sensor module using a wire bonding method.

According to experimental results of the present invention, an image sensor module having a size of 7.8 mm×9.0 mm×6.48 mm by the method shown in FIG. 1 could be formed to have a size of 7.8 mm×7.8 mm×4.9 mm.

Figure 4:
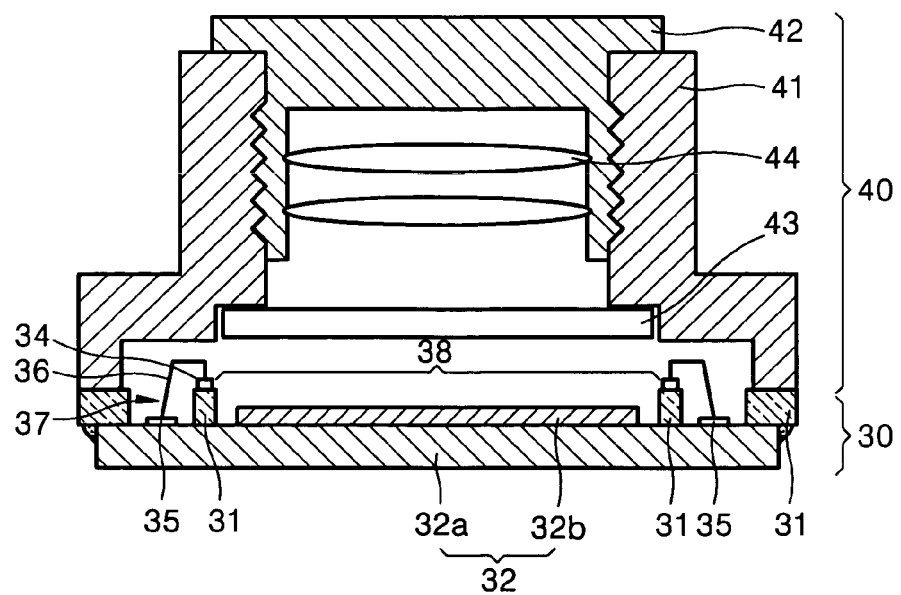
FIG. 4 is a schematic cross-sectional view showing a camera module package including the image sensor module of FIG. 2.
Figure 5:
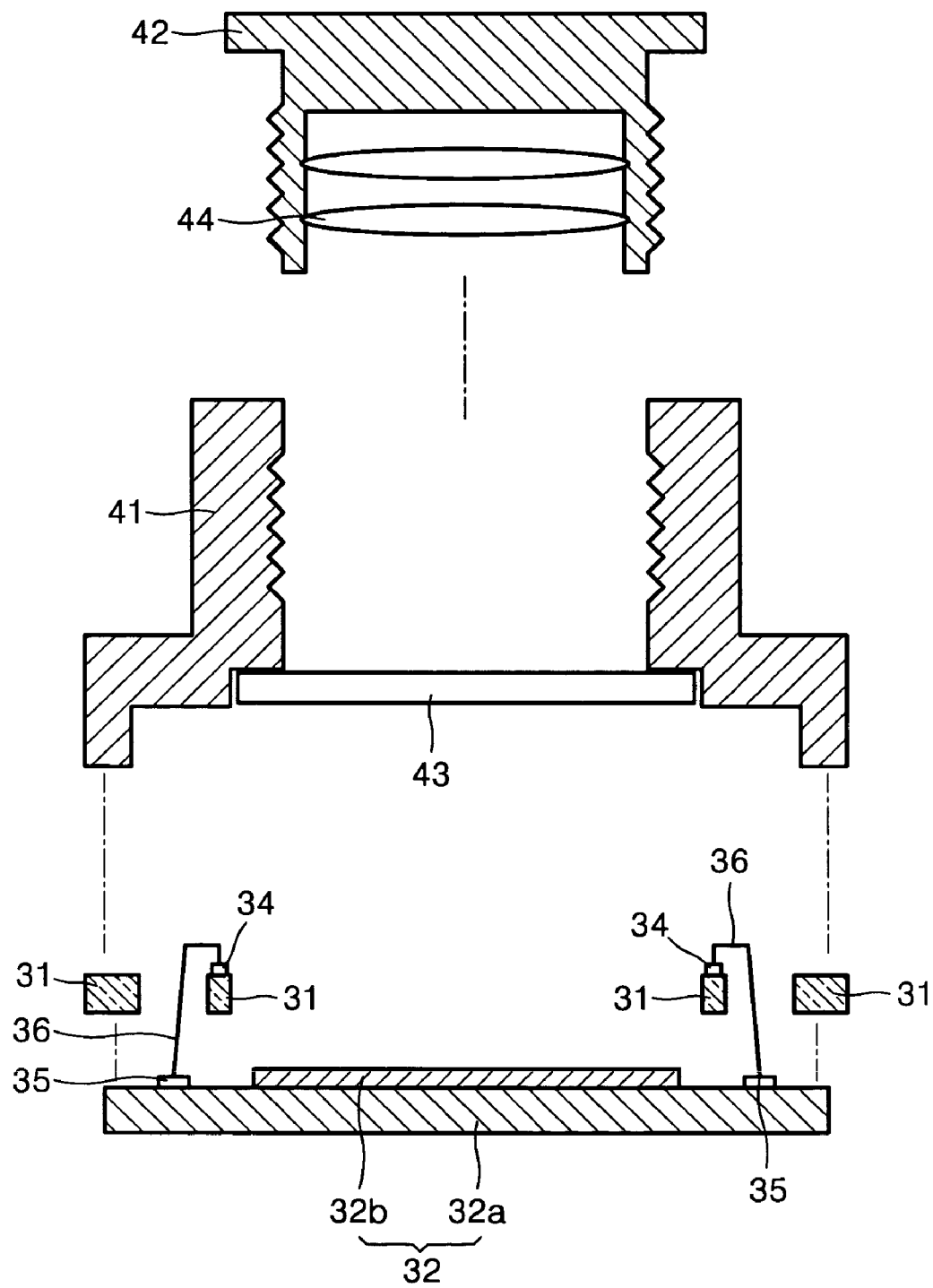
FIG. 5 is an exploded cross-sectional view showing the camera module package including the image sensor module of FIG. 2.

FIG. 4 is a schematic cross-sectional view showing a camera module package including the image sensor module of FIG. 2, and FIG. 5 is an exploded cross-sectional view showing the camera module package having the image sensor module of FIG. 2.

Referring to FIGS. 4 and 5, the camera module package includes the image sensing device unit 32, the circuit board 31, the connecting unit 36, and a housing 40. Here, the image sensing device unit 32, the circuit board 31, and the connecting unit 36 are formed on the image sensor module 30 shown in FIGS. 2 and 3, and the camera module package according to the present embodiment includes the image sensor module 30 and the housing 40. Therefore, the same reference numerals are used for the same elements, and detailed descriptions for those are omitted.

The housing 40 is attached on a surface of the image sensor module 30 so as to protect the inside of the camera module package and maintain an airtight status. Specifically, it is desirable that the housing 40 is attached to an opposing surface of the image sensing device 32a.

That is, the housing 40 for protecting the camera module package and maintaining the airtight status may be attached to the upper portion of the image sensor module 30, and it is desirable that the housing 40 is attached to the upper surface of the circuit board 31 and the image sensing device unit 32 is attached to the lower surface of the circuit board 31.

Here, the board connecting pad 34 is formed on the upper surface of the circuit board 31, and electrically connected to the device connecting pad 35 by the wire bonding method through the bored portion of the circuit board 31. Here, the device connecting pad 35 is formed at the bored portion on the surface of the image sensing device 32a, which is attached to the circuit board.

The housing 40 includes a lens barrel unit 41, a protective cover 42, an infrared ray (IR) and reflection prevention filter 43, and a lens 44.

The lens barrel unit 41 is formed as a hole penetrating the main body of the housing 40 so that the image which will be photographed can pass through there. The protective cover 42 protects the inside of the camera module package and maintains the airtight status therein, and is installed on an outer end portion of the lens barrel unit 41.

The IR and reflection prevention filter 43 shields against infrared rays induced into the image sensor module 30 and prevents light from being reflected, and is installed at an inner end portion of the lens barrel unit 41 on the pixel area part 32b. Thus, the upper surface of the IR and reflection prevention filter 43 is coated to cut the IR (IR-cut coating), and the lower surface of the IR and reflection prevention filter 43 is coated to prevent reflection (anti-reflection coating).

Two or more lenses 44 are mounted in the lens barrel unit 41 so as to be moved along threads formed on the inner surface of the lens barrel unit 41.

The image sensor module 30, which is constructed of the circuit board 31 and the image sensing device unit 32, which are electrically connected to each other in the wire bonding method, has nearly the same width as that of the image sensing device unit 32. Because the pixel area part 32b of the image sensing device unit 32 is inserted in the window hole 38 formed on the circuit board 31, the height of the image sensor module 30 can be reduced, and thus the size, that is, the width and height of the camera module package including the image sensor module 30 therein can be reduced.

In the case of a conventional image sensor module 10 using the wire bonding method shown in FIG. 1, since the pixel area part 13 is formed on the circuit board 11 and the image sensing device 12a, the height from the upper surface of the circuit board 11 is relatively high. Accordingly, in order to ensure the effective range from the lens 24 to the pixel area part 12b that is required to focus the image on the pixel area part 12b, the entire height of the camera module package is inevitably high.

However, in the image sensor module 30 according to the embodiments of the present invention, the height of the pixel area part 32b can be formed to be lower than that of the circuit board 31, and thus the entire height of the camera module package for ensuring the effective range from the lens 44 to the pixel area part 32b can be reduced.

The image sensor module and the camera module package that includes the image sensor module can be formed as chip size while being formed in the wire bonding method. These can be applied to various image obtaining apparatuses such as a built-in camera used in a mobile phone, as well as the digital camera.

According to the image sensor module and the camera sensor module including said image sensor module of the present invention, the image sensor module of chip size having reduced width and height can be formed while having the structure of electrically connecting the circuit board and the image sensing device mounted on the circuit board in the wire bonding method.

Also, since the size of the image sensor module included in the camera module package can be reduced, the width and height of the camera module package can be also reduced.

That is, the chip size package (CSP) can be manufactured using the conventional wire bonding equipment, and thus the conventional equipment can be used effectively without replacing it, costs for manufacturing the CSP can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor module comprising:
   an image sensing device unit that comprises an image sensing device and a pixel area part;
   a device connecting pad formed on a surface of the image sensing device;
   a circuit board that comprises at least one hole corresponding to a location of the pixel area part and at least one other hole corresponding to a location of the device connecting pad;
   a board connecting pad; and
   a connecting unit for connecting the device connecting pad and the board connecting pad,
   wherein the board connecting pad is attached to one surface of the circuit board and the image sensing device unit is attached to the opposite surface of the circuit board.

2. The image sensor module of claim 1, wherein the pixel area part is formed on a surface of the image sensing device.

3. The image sensor module of claim 1, wherein the pixel area part collects light images to be photographed.

4. The image sensor module of claim 1, wherein the device connecting pad assists in forming an electrical connection to an external device.

5. The image sensor module of claim 1, wherein the image sensing device unit is attached to the circuit board so that the image sensing device is attached to the circuit board.

6. The image sensor module of claim 1, wherein the connecting unit is a bonding wire for connecting the circuit board and the image sensing device unit in a wire bonding method.

7. The image sensor module of claim 6, wherein the device connecting pad is exposed through the at least one other hole such that the bonding wire directly connects to the device connecting pad.

8. The image sensor module of claim 1, wherein the perimeter of the image sensing device unit does not extend beyond the surface of the circuit board that is opposite to the surface to which the image sensing device unit is attached.

9. The image sensor module of claim 7, wherein the pixel area part is formed on a surface of the image sensing device.

10. A camera module package comprising:
    an image sensing device unit that comprises an image sensing device and a pixel area part;
    a device connecting pad formed on a surface of the image sensing device;
    a circuit board that comprises at least one hole corresponding to a location of the pixel area part and at least one other hole corresponding to a location of the device connecting pad;
    a board connecting pad;
    a housing attached to the circuit board; and
    a connecting unit for connecting the device connecting pad and the board connecting pad,
    wherein the board connecting pad is attached to one surface of the circuit board and the image sensing device unit is attached to the opposite surface of the circuit board.

11. The camera module package of claim 10, wherein the housing maintains an airtight status for the module.

12. The camera module package of claim 10, wherein the housing comprises a lens barrel unit for passing through light images collected from outside the module.

13. The camera module package of claim 12, wherein the housing comprises a cover installed on an outer end portion of the lens barrel unit.

14. The camera module package of claim 12, wherein the housing comprises an infrared ray and reflection prevention filter installed at an inner end portion of the lens barrel unit near the pixel area part, for shielding against infrared rays and preventing light induced into the image sensing device unit from being reflected.

15. The camera module package of claim 12, wherein the housing comprises a lens being mounted in the lens barrel unit so as to be moved along threads that are formed on the inner surface of the lens barrel unit.

16. The camera module package of claim 10, wherein the pixel area part is formed on a surface of the image sensing device.

17. The camera module package of claim 10, wherein the pixel area part collects light images to be photographed.

18. The camera module package of claim 10, wherein the device connecting pad assists in forming an electrical connection to an external device.

19. The camera module package of claim 10, wherein the image sensing device unit is attached to the circuit board so that the image sensing device is attached to the circuit board.

20. The camera module package of claim 10, wherein the connecting unit is a bonding wire for connecting the circuit board and the image sensing device unit in a wire bonding method.

21. The camera module package of claim 20, wherein the device connecting pad is exposed through the at least one other hole such that the bonding wire directly connects to the device connecting pad.

22. The camera module package of claim 10, wherein the perimeter of the image sensing device unit does not extend beyond the surface of the circuit board that is opposite to the surface to which the image sensing device unit is attached.

23. The camera module package of claim 22, wherein the pixel area part is formed on a surface of the image sensing device.

24. The camera module package of claim 10, wherein the housing, the at least one hole in the circuit board, and the pixel area part are lined up so that light may pass through the housing and the at least one hole and contact the pixel area part.

25. An image obtaining apparatus comprising a camera module package that comprises:
    an image sensing device unit that comprises an image sensing device and a pixel area part;
    a device connecting pad formed on a surface of the image sensing device;
    a circuit board that comprises at least one hole corresponding to a location of the pixel area part and at least one hole corresponding to a location of the device connecting pad;
    a board connecting pad;
    a housing attached to the circuit board; and
    a connecting unit for connecting the device connecting pad and the board connecting pad,
    wherein the board connecting pad is attached to one surface of the circuit board and the image sensing device unit is attached to the opposite surface of the circuit board.

26. The image obtaining apparatus of claim 25, wherein the connecting unit is a bonding wire for connecting the circuit board and the image sensing device unit in a wire bonding method.

27. The image obtaining apparatus of claim 26, wherein the device connecting pad is exposed through the at least one other hole such that the bonding wire directly connects to the device connecting pad.

* * * * *